(12) United States Patent
Tsujii

(10) Patent No.: US 6,631,499 B1
(45) Date of Patent: *Oct. 7, 2003

(54) LASER IMAGE CONNECTABLE TO MEDICAL MODALITY OF A WORKSTATION

(75) Inventor: Osamu Tsujii, Yokohama (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/700,042

(22) Filed: Aug. 20, 1996

Related U.S. Application Data

(63) Continuation of application No. 08/231,180, filed on Apr. 22, 1994, now abandoned.

(30) Foreign Application Priority Data

Apr. 27, 1993 (JP) .............................................. 5-123615

(51) Int. Cl.[7] .............................................. G06F 17/21
(52) U.S. Cl. ...................................... 715/530; 358/1.15
(58) Field of Search .................................. 395/114, 118; 707/517, 530; 345/418; 358/1.2, 1.16, 1.17, 1.18, 1.15; 709/203, 217–219; 715/517, 530

(56) References Cited

U.S. PATENT DOCUMENTS

| | | | |
|---|---|---|---|
| 4,833,625 A | * 5/1989 | Fisher et al. | 364/518 |
| 5,113,494 A | * 5/1992 | Menendez et al. | 395/163 |
| 5,172,103 A | 12/1992 | Kita | 340/731 |
| 5,437,024 A | * 7/1995 | French | 707/10 |
| 5,469,532 A | * 11/1995 | Gerlach et al. | 358/1.2 |
| 5,481,657 A | 1/1996 | Schubert et al. | 395/118 |
| 5,734,915 A | * 3/1998 | Roewer | 395/773 |
| 5,933,584 A | * 8/1999 | Maniwa | 358/1.15 |

FOREIGN PATENT DOCUMENTS

EP 0475734 3/1992

OTHER PUBLICATIONS

Berson, Client/Server Architecture, 1992, pp. 42–48, 1992.*
Zimmerman, Canon Builds Printer Into Notebook, PC Week, v. 10, n. 14, p.20, Apr. 12, 1993.*
R.A. Robb and C. Barillot, *Interactive Display and Analysis of 3–D Medical Images*, IEEE Transactions on Medical Imaging, vol. 8, Nol 3, Sep. 1989.*
J.A. Sanders and W.W. Orrison, *Design and Implementation of a Clinical MSI Workstaton*, Fifth Annual IEEE Symposium on Computer–Based Medical Systems, 1992.*
"High–Quality Color Printers Launched", UNIX Today, p. 26 (Aug. 20, 1990).
F. Beltrame, et al., "3D Brain Anatomy and Surgery in X–11 Environment", Annual International Conference of the IEEE Engineering in Medicine and Biology Society, vol. 12, No. 1, pp. 0221–0223 (1990).

* cited by examiner

*Primary Examiner*—Joseph H. Feild
(74) *Attorney, Agent, or Firm*—Fitzpatrick, Cella, Harper & Scinto

(57) ABSTRACT

Files of acquired images are stored in a directory of computer tomography (CT) in the form of ACR/NEMA format file. For printing the images by a laser imager, application software stored in the laser imager is started from CT, whereby an interactive indication of the application software is indicated on a CRT in CT. An operator inputs a name of a directory where the image information files are present, and operates a window information setting switch, a format information setting switch, a font information setting switch, an overlay information switch and a print start switch with a mouse to set respective information and then to print the images.

14 Claims, 9 Drawing Sheets

LASER IMAGE CONNECTABLE TO MEDICAL MODALITY OF A WORKSTATION

This application is a continuation of application Ser. No. 08/231,180, filed Apr. 22, 1994, now abandoned.

BACKGROUND OF THE INVENTION

1. Field of the Invention

The present invention relates to a laser imager used in network-connection with a medical modality or with a workstation.

2. Related Background Art

A laser imager for medical use is defined as an apparatus for writing an image transferred from a medical modality such as computer tomography (CT), magnetic resonance imaging (MRI) or digital subtraction angiography (DSA) onto a film by using a laser. Concerning the connection between the medical laser imager and the medical modality, a conventional video interface is being replaced with a digital interface using RS422 or with a digital interface in the broad sense such as a network interface, for example, Ethernet.

Normally, information concerning an image is managed by separating image information from header information within the medical modality. The image information means a gray-scale image itself taken by the medical CT, MRI, DSA, or the like. The header information is overlay information, for example including a patient name, a patient ID, a modality name, acquired (photographed) date and time, acquiring conditions and the gray scale and the like. With respect to the video interface being used for connection, an image indicated on a CRT monitor in the medical CT, MRI, DSA or the like is transferred to the laser imager by scanning data in a frame memory including the header information overlaid on the gray-scale image and then converting it into a video signal. Here, character information in the header information is overlaid after it is converted into fonts. If digital interface such as RS422 is being used for connection, the data in the frame memory including the header information overlaid on the gray-scale image indicated on the CRT monitor in the medical modality is transferred to the laser imager as it stands.

An operator determines the setting of window information for transferring the image to the laser imager while observing the CRT monitor as to the medical modality. Further, for image output by the laser imager, the operator sets through a keypad connected to the laser imager, format information for determining a layout for printing a plurality of images on a single film, shape for nonlinearly converting shades of gray in the image, starting to store images, starting of print, etc.

Recently, the network interface such as Ethernet tends to be used in accordance with the increasing popularity of a workstation of the medical modality. In case of the network interface being used, the American College of Radiology (ACR)/National Electrical Manufactures Association (NEMA) format standardized in the U.S.A. is often used for data format between the medical modality and the laser imager. With the ACR/NEMA format, the image information and the header information are transferred as a single file to the laser imager and in the laser imager, management by separating the image information from the header information can be employed.

Further, the X Window is standardly used as protocol for interactive indication of a workstation. An operator can operate each workstation in network-connection to execute application software on the other workstation and then to indicate an interactive indication on the workstation at an operating end.

Incidentally, a single ordinary medical image substantially has pixels of, for example, 512×512 to 1024×1024. On the other hand, a print image of the laser imager for medical use is normally a 14×17-inch film with pixels of 4096×5120 matrix. Therefore, it is usual that there are a plurality of images arranged such as three rows and three columns in a single film. A scaling (i.e., magnification change) process is normally effected for the image information and the overlay information in the laser imager in order to print a plurality of images as large as possible on the film.

There are roughly three methods used for the scaling process. The first method is the Pixel Replication method, in which original data closest to a position of an interpolated pixel is used as interpolation data as it stands. The second method is the Bilinear method, in which four original data closest to a position of an interpolating pixel are selected from a two-dimensional space and those are used for linear interpolation. The third method is the Cubic Spline method, in which sixteen original data closest to a position of an interpolated pixel are selected from a two-dimensional space and those are used for Cubic Spline interpolation.

The Pixel Replication method preserves the edge of an image, while the Cubic Spline method can blur or smooth the edge, depending upon employed coefficients. Since it is desirable to preserve the edge for the font information as character information, the Pixel Replication method is suitable for the scaling process of the font information. Further, the Cubic Spline method is suitable for an image of a medical CT or MRI, while the scaling by the Pixel Replication method is suitable for an image of DSA.

SUMMARY OF THE INVENTION (1) Since in the above-described conventional examples the header information and the image information is respectively managed in separate files, the overlay information including the window information, the format information, the gray scale, etc. must be first converted into a single ACR/NEMA format file in order to transfer the files from the medical modality to the laser imager, which requires an application software for executing the ACR/NEMA format on the laser imager or on the network-connection. However, making such application software include the medical modality or the medical network necessitates specific settings for each laser imager, whereby this is a great load for a maker.

(2) For the above-described conventional examples, it is desirable to differentiate a scaling process of image information from that of character information as to a file transferred from the medical CT or MRI. However, since the file is transferred to the laser imager with the character information being overlaid on the image information, it is difficult to differentiate the scaling process of image information from that of character information.

It is a first object of the present invention to overcome the above problem (1) and to provide a laser imager having an application software based on the protocol of X Window, which is executable from a medical modality or a medical network.

It is a second object of the present invention to overcome the above problem (2) and to provide a laser imager which can provide a better diagnostic image.

A first laser imager according to the present invention for achieving the above objects is a laser imager connected in a network with a medical modality or workstation, which has an application software for setting window information for image output, wherein said application software is accessible from said medical modality or workstation connected by the network and an interactive indication of said application software is indicated on the medical modality or workstation at an operation end.

A second laser imager is a laser imager connected in a network with a medical modality or workstation, which has an application software for setting format information for image output, wherein said application software is accessible from said medical modality or workstation connected by the network and an interactive indication of said application software is indicated on the medical modality or workstation at an operation end.

A third laser imager is a laser imager connected in a network with a medical modality or workstation, which has an application software for setting font information for image output, wherein said application software is accessible from said medical modality or workstation connected in the network and an interactive indication of said application software is indicated on the medical modality or workstation at an operation end.

A fourth laser imager is characterized in that as to a digital-connected laser imager, a scaling function for scaling image information is differentiated from that for scaling overlay information.

A fifth laser imager is characterized in that as to a digital-connected laser imager, a scaling rate for scaling image information is differentiated from that for scaling overlay information.

A sixth laser imager is characterized in that a gray-scale image is printed on a boundary of marginal space when an image is arranged on a film.

A seventh laser imager is characterized in that when a gray-scale image is printed on a boundary of marginal space in arranging an image on a film, whether the gray-scale image is to be applied to the boundary on the film or not is set.

The first laser imager having the above structure is so arranged that an interactive indication of the application software in the laser imager is executed in the medical modality or workstation so that window information is set for an output image from the medical modality.

The second laser imager is so arranged that an interactive indication of the application software in the laser imager is executed in the medical modality or workstation so that format information is set for an output image from the medical modality.

The third medical laser imager is so arranged that an interactive indication of the application software in the laser imager is executed in the medical modality or workstation so that overlay information including font information and the gray-scale may be set for an output image from the medical modality.

The fourth medical laser imager performs scaling for image information and overlay information using different scaling functions.

The fifth medical laser imager performs scaling for image information and overlay information using different scaling rates.

The sixth medical laser imager prints a gray-scale image on the boundary surrounding a medical image on a film.

The seventh medical laser imager is arranged to set as to which image is to be printed with a gray-scale image on the boundary in case the gray-scale image is printed on the boundary surrounding a medical image on a film.

BRIEF DESCRIPTION OF THE PREFERRED EMBODIMENTS

The present invention will be described in detail based on the embodiments as illustrated in the accompanying drawings.

Figure 1:
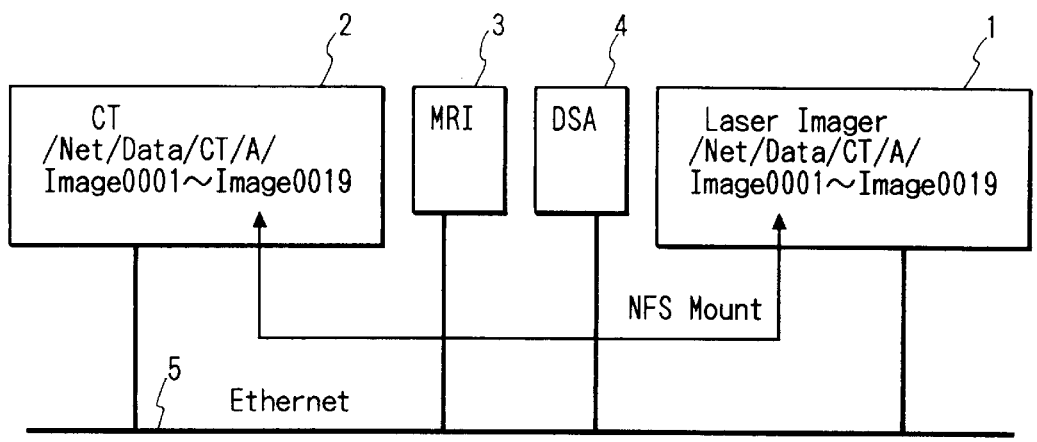
FIG. 1 is a network connection diagram in a first embodiment.

FIG. 1 is a network connection diagram of the first embodiment, in which a laser imager 1, CT 2, MRI 3 and DSA 4 as medical modalities, and an unillustrated workstation are network-connected through Ethernet 5. In this embodiment, information of an image or the like is shared in a network film system (hereinafter referred to as NFS). It should be noted in this case that information within CT 2, MRI 3 and DSA 4 as medical modalities can be freely read from the laser imager 1, which is not suitable in respect of protection of patient's secret.

The medical modality in the following description will be explained about by restricting CT 2. When a patient A is examined by CT 2, an acquired image is stored in Net/Data/A in a directory in CT 2 by the form of ACR/NEMA format file. For example, if numbers of acquired images are twenty, numbers of stored files becomes twenty, which are named as Image0000.nema–Image0019.nema, respectively.

Figure 2:
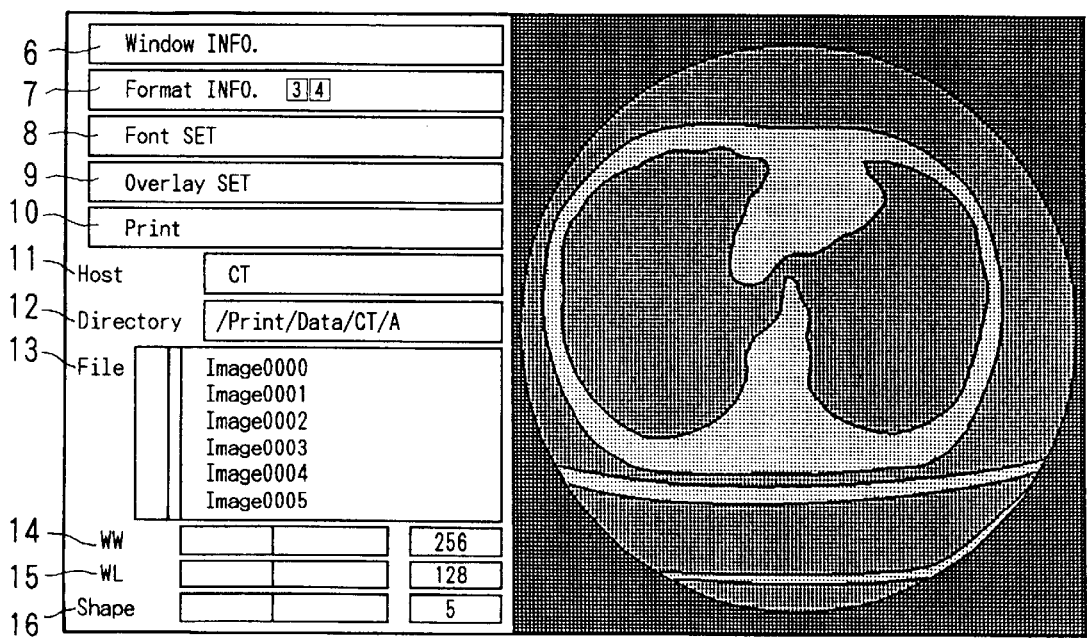
FIG. 2 is an illustration to show an interactive indication in setting window information of an application software indicated on a CRT monitor of CT.

In a case of printing these images by the laser imager, an application software stored in the laser imager is started up from CT 2. Indicated on a CRT monitor in CT 2 are an interactive indication of the application software as shown in FIG. 2 including a window information setting switch 6, a format information setting switch 7, a font information setting switch 8, an overlay information setting switch 9 and a print start switch 10. First, by clicking on the window information setting switch 6 with a mouse, window information is set. Upon starting of the application software, the interactive indication is in the window information setting mode as shown in FIG. 2.

A device name of the medical modality is input in a medical modality (Host) input into box 11. In this case, CT is input therein. Then a directory storing the image information files is input in a directory input box 12. In NFS, a directory is designated as a directory as seen from the laser imager 1. Thus, to designate the directory of Net/Data/A in CT 2, /Print/Net/CT/A is input in the directory input box 12. After the input, the files Image0000.nema–Image0019.nema are transferred from CT 2 to the laser imager 1. When a file name as indicated by a file selection box 13 is clicked with the mouse, an image for window information to be set is designated. Again clicking the file name, the image is indicated on the CRT monitor.

During observation of this image, an operator respectively inputs numerical values of window width input box 14, window level input box 15 and shape input box 16 to set a window width, a window level and a density (gray-tone) of image (Shape Value). The density of image (gray-level) is nonlinearly changed by the numerical value input in the shape value input box 16. Also, the designations of window size and image density can be executed without displaying the image on the CRT monitor. Then, by selecting a plurality of files by the file selection box, a plurality of images can be simultaneously set instead of performing settings image by image.

Figure 3:
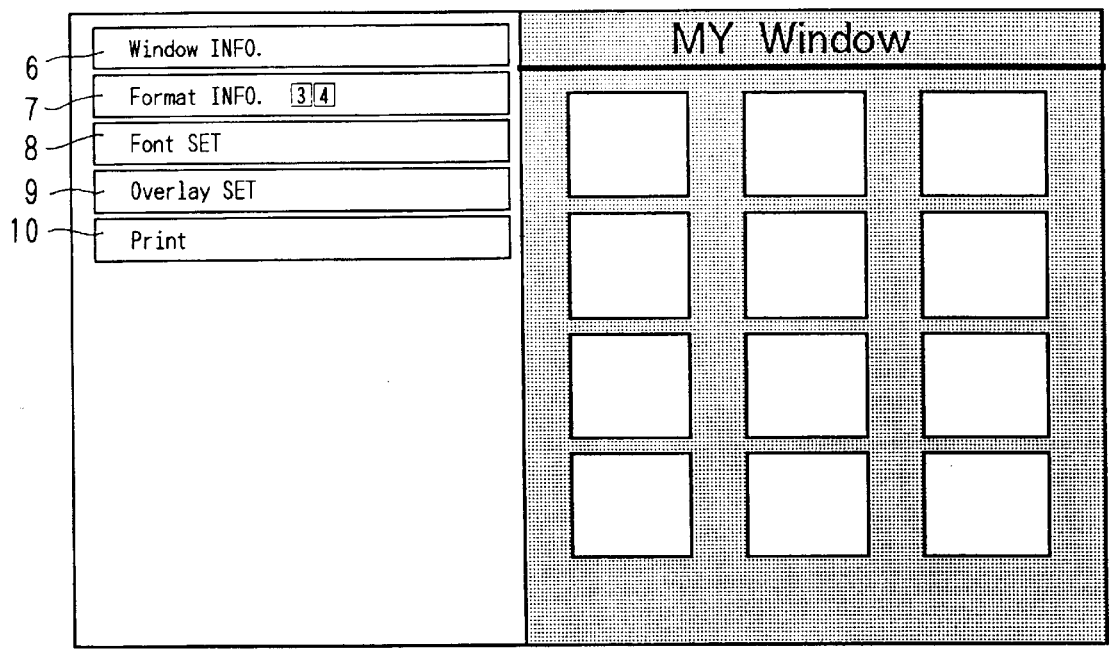
FIG. 3 is an illustration of a square format mode setting.
Figure 4:
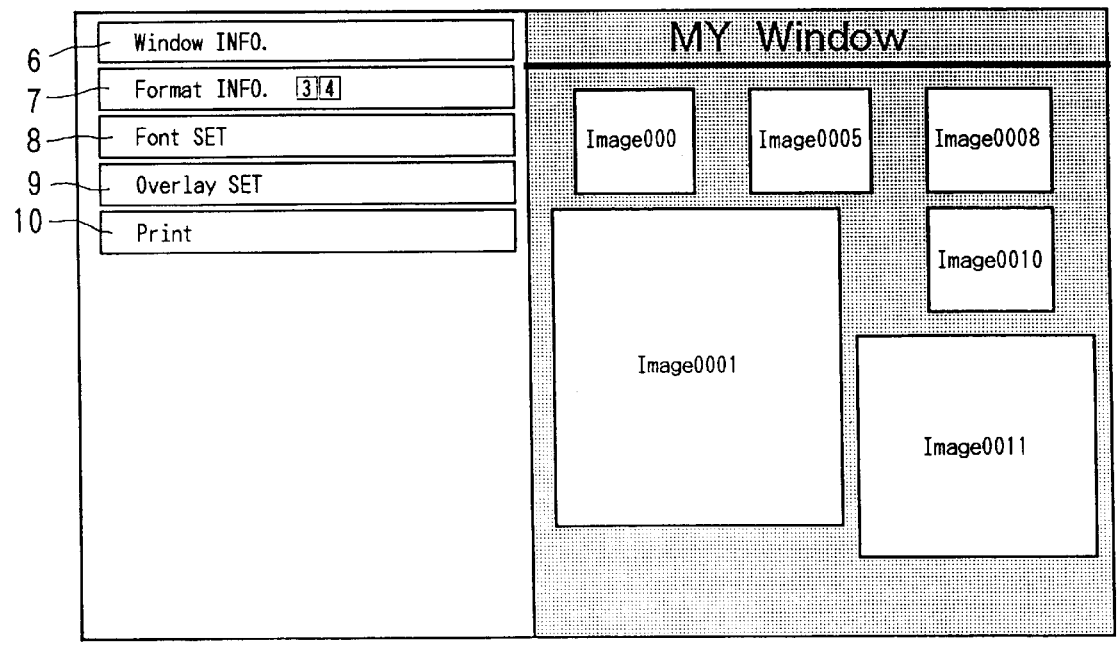
FIG. 4 is an illustration of a free format mode.

Next, clicking the format information setting switch 7 by the mouse, a number of images to be printed on a single film is input. Two numerical values of the format information setting switch 7 represent a number of images in the horizontal direction and a number of images in the vertical direction on the film from the right side. If the mouse is clicked again after inputting two numerical values, format positions of images are designated as blank squares as shown in FIG. 3. If "X and X" are input into the format information setting switch 7, a free format setting mode becomes active as shown in FIG. 4, in which the operator can freely set the size and the position by regarding a blank square frame as an image. Images to be printed on the film may be designated by inputting a file name of each image in a corresponding blank square portion, as shown in FIG. 4, either in the square format mode or in the free format mode.

Most medical images are generally circular. Thus, font information such as a patient name, acquiring conditions of image, a position of cross section, etc. is normally printed at four corners of each designated square as described. Since these font informations are normally described by using character codes in ACR/NEMA format file, the operator has to determine which font information should be located at which position and in which font in the laser imager 1. In this embodiment, the font information is set by the font information setting switch 8.

Figure 5:
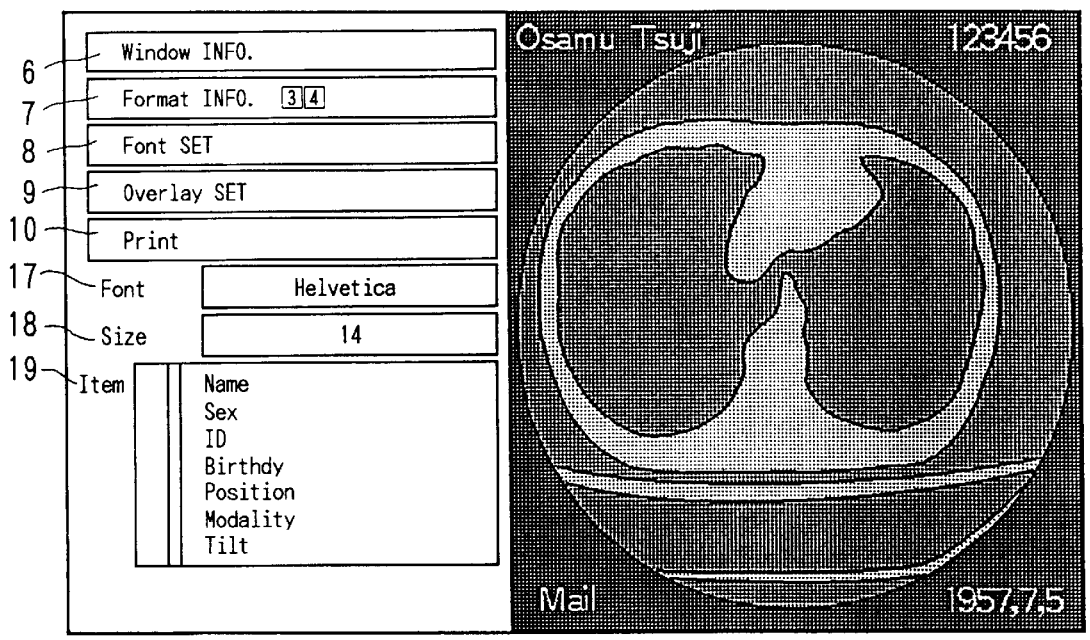
FIG. 5 is an illustration for setting font information.

Double-clicking the font information setting switch 8 with the mouse, the interactive indication is regarded as the font information setting mode as shown in FIG. 5. The operator inputs a type of font to be printed on the film, in a font input box 17, inputs a size of font into a font size input box 18, clicks items of the font information to be overlaid on the image with the mouse, in an item selection box 19, and locates the selected items on the window through the mouse.

Figure 6:
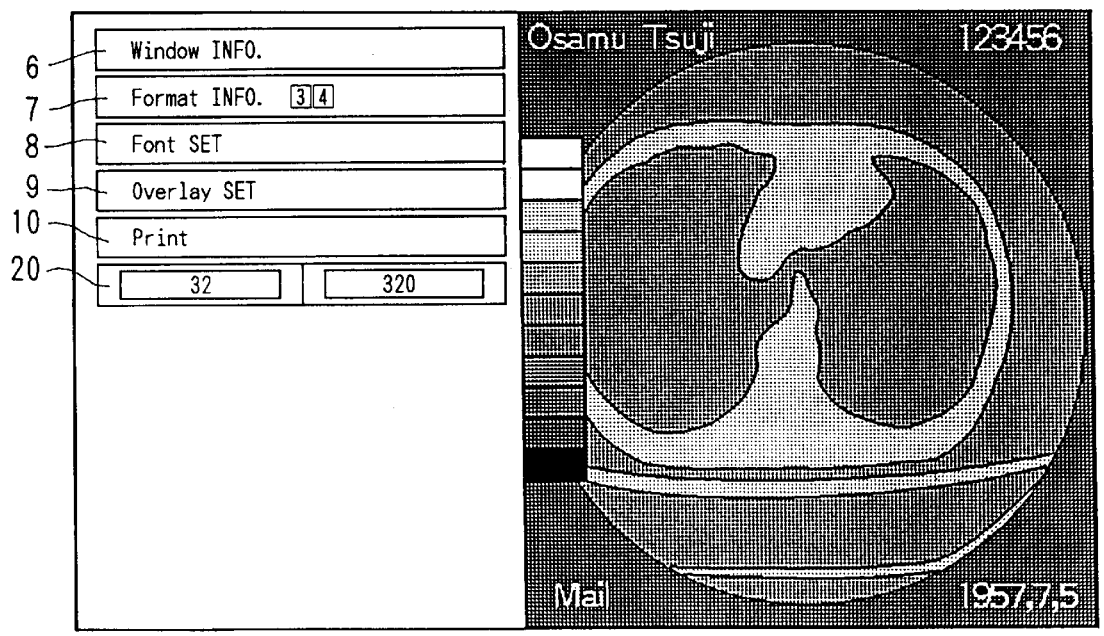
FIG. 6 is an illustration for setting overlay information.

If the overlay information such as the gray-scale is not written in the ACR/NEMA format files Image0000.nema–Image0019.nema in CT 2, the operator may double-click the overlay information setting switch 9 with the mouse. Then the interactive indication is changed to an overlay information setting mode as shown in FIG. 6 and the gray-scale can be overlaid on the image. Then the operator inputs numerical values into a pixel input box 20. Left and right numerical values correspond to a number of horizontal pixels and a number of vertical pixels, respectively, in the gray-scale image. The CRT monitor indicates an image with the overlay image overwritten. Here, setting font information and overlay information can be made image by image or every selected number of images. Since these informations, all is defined as default value, no specific setting is necessary in a case that the default values as they stand may be acceptable.

After completing the above settings, the operator double-clicks the print start switch 10 with the mouse, so that the output images from CT 2 are printed on a film by the laser imager 1.

Figure 7:
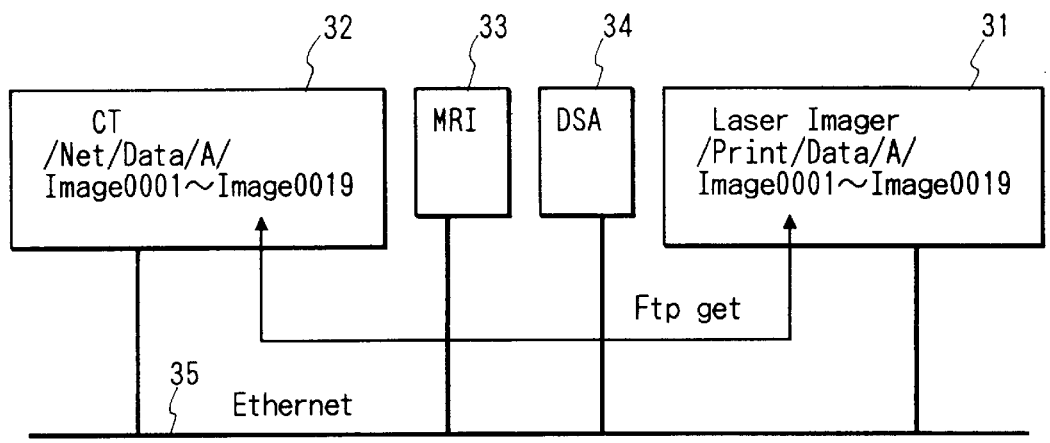
FIG. 7 is a network connection diagram of a second embodiment.

FIG. 7 is a network connection diagram in the second embodiment, in which a laser imager 31, CT 32, MRI 33 and DSA 34 as medical modalities, and an unrepresented workstation are networked through Ethernet 35. In the present embodiment, window information stored in CT 32, MRI 33 and DSA 34 of medical modalities is not mounted by NFS, different from the first embodiment. Thus, the window information in the medical modalities cannot be freely transferred to the laser imager 31 and therefore file transfer by File transfer protocol (FTP) is necessary.

When a patient A is examined by CT 32, an acquired image is stored into a directory of Net/Data/A in CT 32 by the form of ACR/NEMA format file. For example, if there are twenty acquired images, there are twenty stored files, which are named as Image0000–Image0019.

Figure 8:
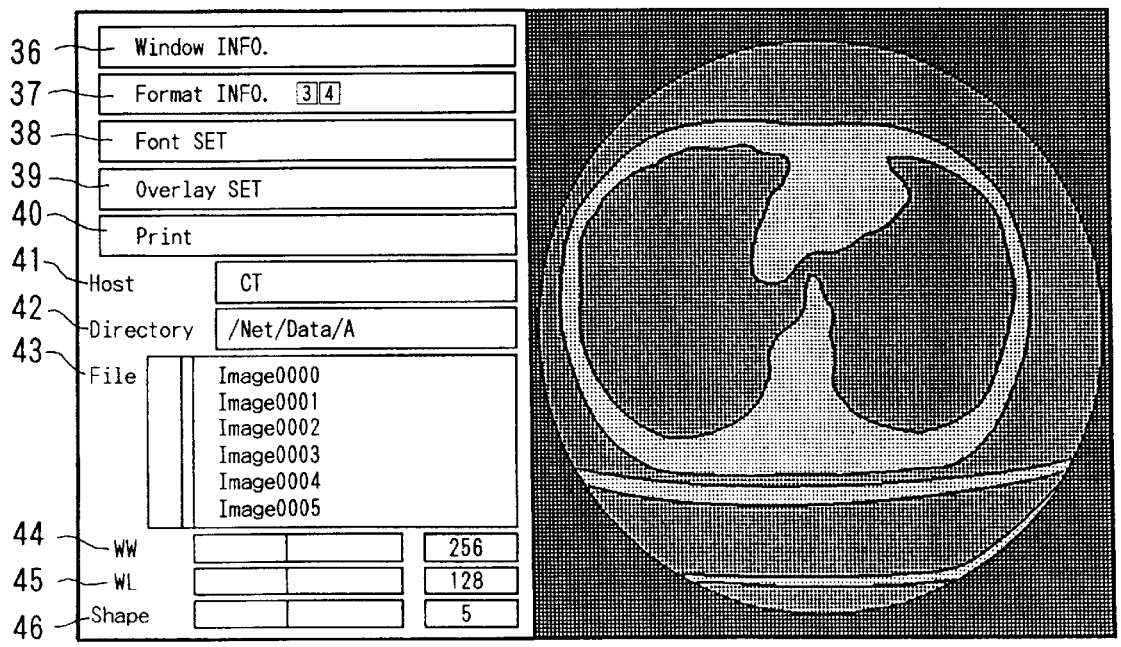
FIG. 8 is an illustration to show an interactive indication of an application software for setting window information as indicated in CT.

For printing these images by the laser imager, an application software stored in the laser imager is started up from the side of CT 32. An interactive indication of the application software is indicated on a CRT monitor in CT 32, as shown in FIG. 8. There are indicated a window information setting switch 36, a format information setting switch 37, a font information setting switch 38, an overlay information setting switch 39 and a print start switch 40. Upon start-up of the application software the window information setting mode becomes active as shown in FIG. 8.

First, the operator clicks the window information setting switch 36 with the mouse to set window information. In order to transfer the image information files Image0000–Image0019 from CT 32 to the laser imager 31, the operator inputs a name of the medical modality storing the image information files and a directory name in the medical modality into a medical modality input box 41 and a directory input box 42.

In this embodiment, the operator inputs CT as the medical modality name and Net/Data/A as the directory name as shown in FIG. 8. Executing Ftp transfer, all the twenty image information files Image0000–Image0019 existing in the directory Net/Data/A in CT 32 are transferred from CT 32 to a directory Print/Net/Data/A in the medical laser imager 31. After the file is transferred, the window information is set similarly as in the first embodiment through a file selection box 43, a window width input box 44, a window level input box 45 and a shape value input box 46. Then the operator can execute start-up of printing by operating the print start switch 40.

Figure 9:
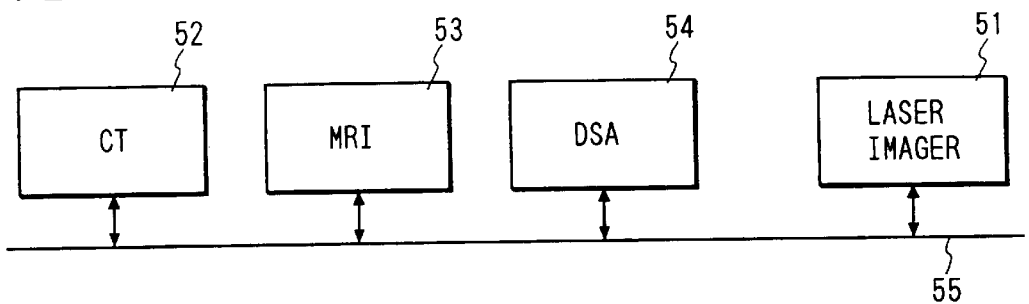
FIG. 9 is a network connection diagram in a third embodiment.
Figure 10:
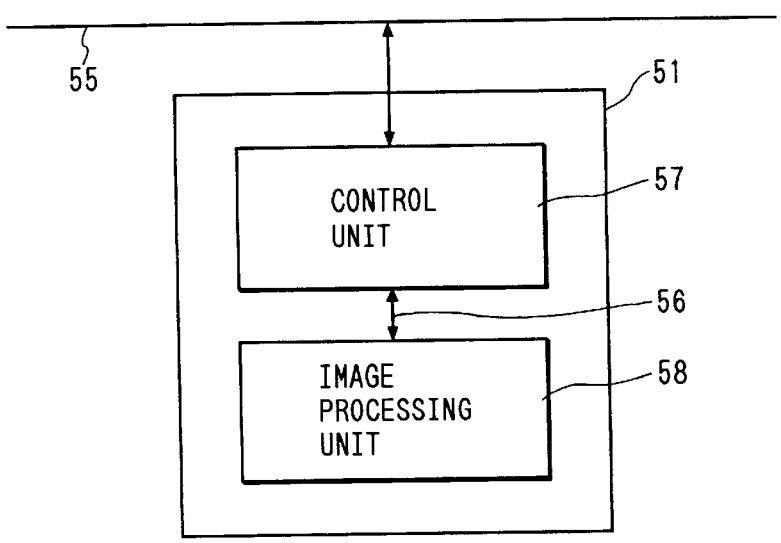
FIG. 10 is a block circuit diagram of a laser imager.

FIG. 9 is a network connection diagram with medical modalities and a laser imager in the third embodiment, in which a laser imager 51, CT 52, MRI 53 and DSA 54 are networked through Ethernet 55. As shown in FIG. 10, the laser imager 51 is composed of a control unit 57 and an image processing unit 58 connected by SCSI bus circuit 56, and the control unit 57 is connected to Ethernet 55.

Figure 11:
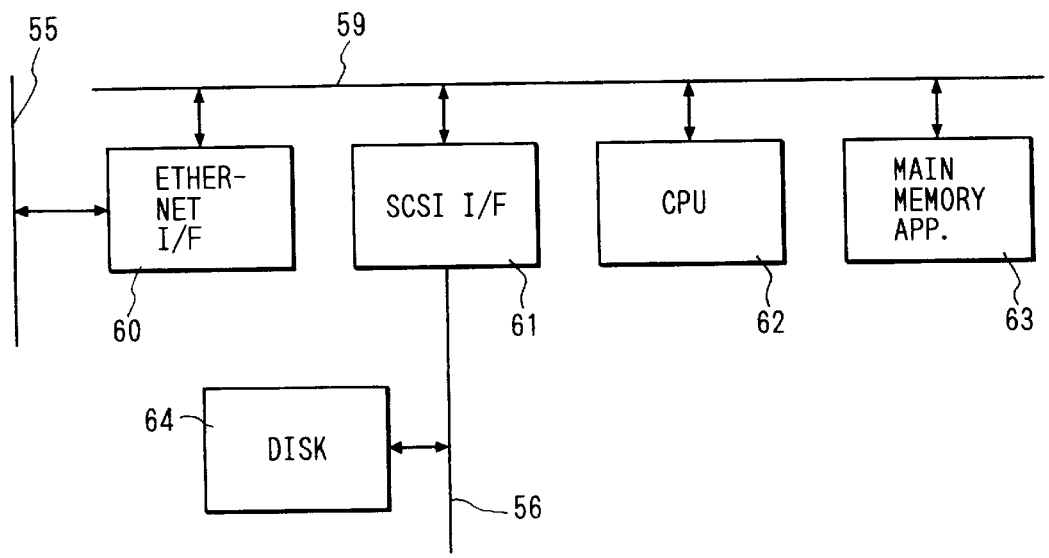
FIG. 11 is a block circuit diagram of a control unit.

FIG. 11 is a block diagram of the control unit 57, in which CU bus circuit 59 connects between Ethernet I/F 60, SCSI I/F 61, CPU 62 and a main memory unit 63; the SCSI I/F 60 is connected to a disc 64 through the SCSI bus circuit 56; and the Ethernet I/F 60 is connected to Ethernet 55.

Figure 12:
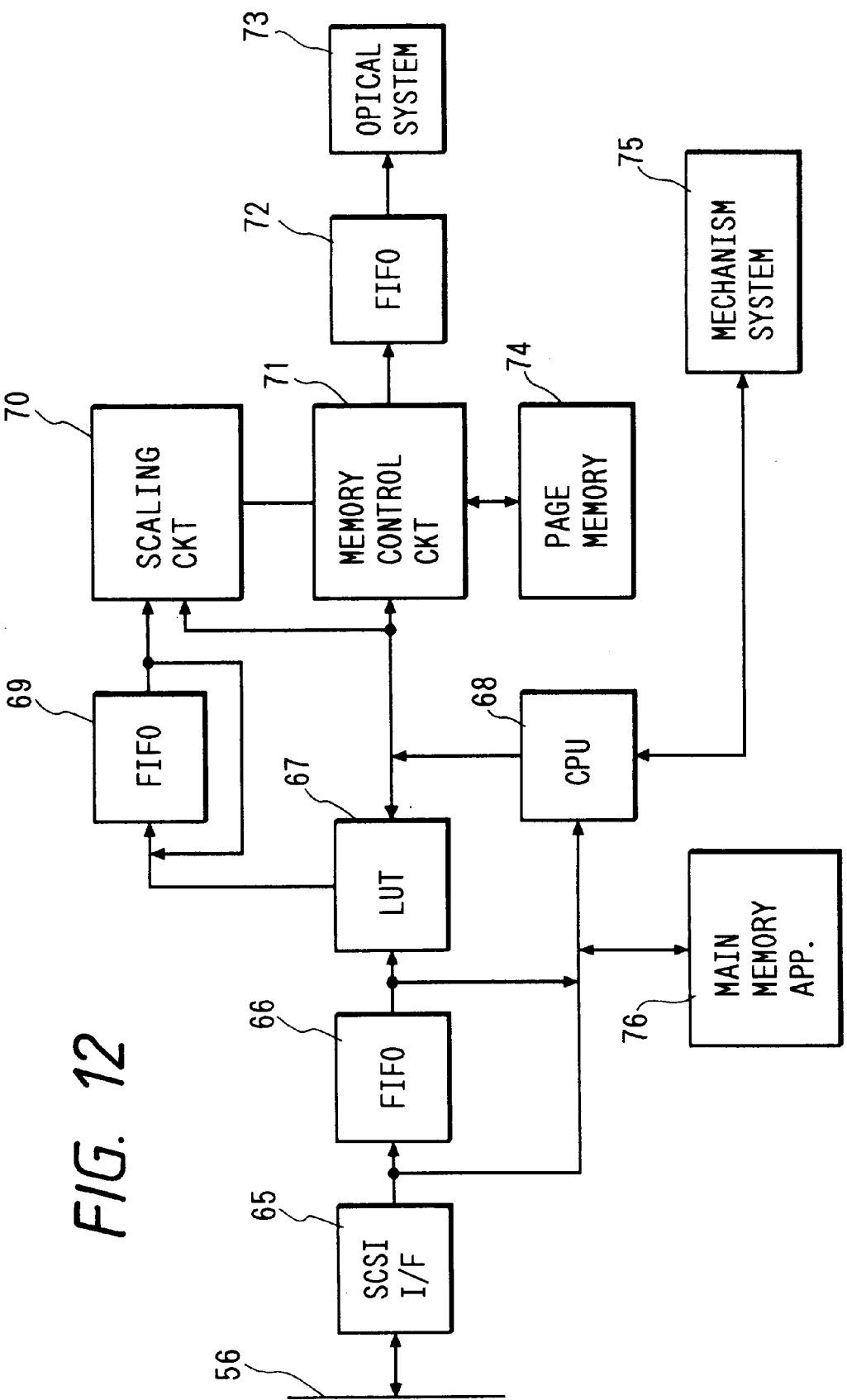
FIG. 12 is a block circuit diagram of an image processing unit.

FIG. 12 is a block diagram of the image processing unit 58, in which an output of SCSI I/F 65 connected with the SCSI bus circuit 56 is connected to an input FIFO 66, and an output of input FIFO 66 is connected to a look-up table (hereafter referred to as LUT) 67 and CPU 68. An output of LUT 67 is connected to an image FIFO 69 having a loop structure, a scaling circuit 70 and a memory control circuit 71, and an output of memory control circuit 71 is connected to an optical system 73 through an output FIFO 72. Also, a page memory 74 having pixels of 4096×5120 matrix corresponding to a film is connected to the memory control circuit 71. Further, CPU 68 is connected to an input of input FIFO 66, a mechanical system 75 and a main memory unit 76, mutually.

When a patient is examined by CT 52, MRI 53 or DSA 54, an acquired image is transferred as an ACR/NEMA format image file through Ethernet 55 and taken in the control unit 57 through Ethernet I/F 60. In case images are arranged for example in three rows and three columns for a single film, nine image files are serially transferred from Ethernet 55. The transferred image files are buffered in the main memory unit 63. After the CPU 62 verifies that the files are regular ACR/NEMA format files, they are stored into the disc 64 through SCSI I/F 61.

The present embodiment is so arranged in order to ensure the image file transfer that after verification of transfer end of all image files for one film, the image files are output from the control unit 57 to the image processing unit 58 through SCSI bus circuit 56. Instead, such an arrangement may be employed that the image files are transferred to the image processing unit 58 while the disc 64 is receiving the image files from Ethernet I/F 60 without waiting for verification of transfer of all image files.

Here, an image file is composed of image information which is a gray-scale image acquired by CT 52, MRI 53 or DSA 54, and header information including character information of patient name, patient ID, medical modality name, acquiring date and time, acquiring conditions, etc. and image information such as the gray scale. The way of transfer of image information to the image processing unit 58 is different from that of header image information.

In case of the image information, a gray-scale image acquired by CT 52, MRI 53 or DSA 54 is transferred to the image processing unit 58 as it stands. In case of header information which includes LUT data for density conversion of image, the LUT data are first transferred prior to transfer of image information. Among the header information, the character information is changed into fonts as image information, which are transferred to the image processing unit 58. Also, the image information such as the gray scale is transferred to the image processing unit 58 as it stands. However, if such image information includes for example density conversion LUT data of the gray scale, the LUT data are first transferred to the image processing unit 58. Here, an address on the film is added to the image information and the header information in the image file, and this address is calculated by CPU 62 in the control unit 57.

The image processing unit 58 categorizes the image information and the header image information transferred from the control unit 57 to the image processing unit 58 roughly into three types of information, i.e., image information, overlay information including for example a patient name, the gray scale, etc. overlaid on the image, and LUT data for density conversion.

An image file transferred from SCSI bus circuit 56 is taken into the input FIFO 66 through SCSI I/F 65, where the type of information is discriminated. If the information of the image file transferred from the control unit 57 is LUT data, it is written into LUT 67. The LUT 67 performs a window information process of converting from N bits to M bits for the image information and the overlay information based on the LUT data, and further performs a process suitable for properties of film. Here, N and M are natural numbers. If the information of the image file transferred from the control unit 57 is image information or overlay information, the LUT 67 performs the above process for the information, the processed information is transferred to the image FIFO 69, and the transferred information is read into the scaling circuit 70 to effect vertical and horizontal scalings thereon.

Because of the loop structure of image FIFO 69, line data can be used plural times in an enlarging process of image information and overlay information. A scaling (magnification) function and a scaling rate (i.e., magnification factor) used in the scaling circuit 70 are calculated in CPU 68 from data attached to the image information and the overlay information captured from SCSI I/F 65, and the thus calculated magnification function and magnification factor are loaded to the scaling circuit 70.

Further, the CPU 68 controls the memory control circuit 71 to designate addresses in the page memory 74 where the image information and the overlay information are to be written and to designate a writing format of overwrite, OR write, AND write and EXOR write. The image information and the overlay information scaled in the scaling circuit 70 is stored in the page memory 74 through the memory control circuit 71.

After the image information and the overlay information for one film is written in the page memory 74, the CPU 68 actuates the mechanical system 75 to start printing of the information on the film. Sub-scanning the film with handling, the image information and the overlay information written in the page memory 74 is output to the output FIFO 72 through the memory control circuit 71 in synchronism with the sub-scanning of film, so as to actuate the optical system 73. The optical system 73 modulates a laser beam based on outputs from the output FIFO 72 and scans it in the scanning direction on the film to print the images.

As for information concerning boundaries of spacings between the images printed on the film and spacings between edges of film and the images, default values depending upon the arrangement of images are stored as boundary image information in the main memory unit 63 in the control unit 57. The boundary image information is transferred from the main memory unit 63 in the control unit 57 to the scaling circuit 70 and then is written in the page memory 74 before the image information and the overlay information is scaled in the scaling circuit 70.

Figure 13:
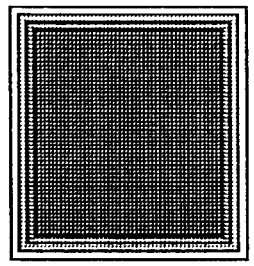
FIG. 13 is an illustration of a boundary image in the fourth embodiment.
Figure 14:
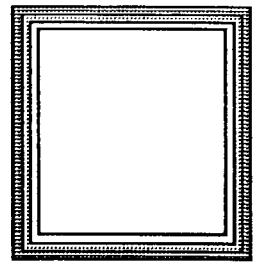
FIG. 14 is an illustration of the other boundary image in the fourth embodiment.
Figure 15:
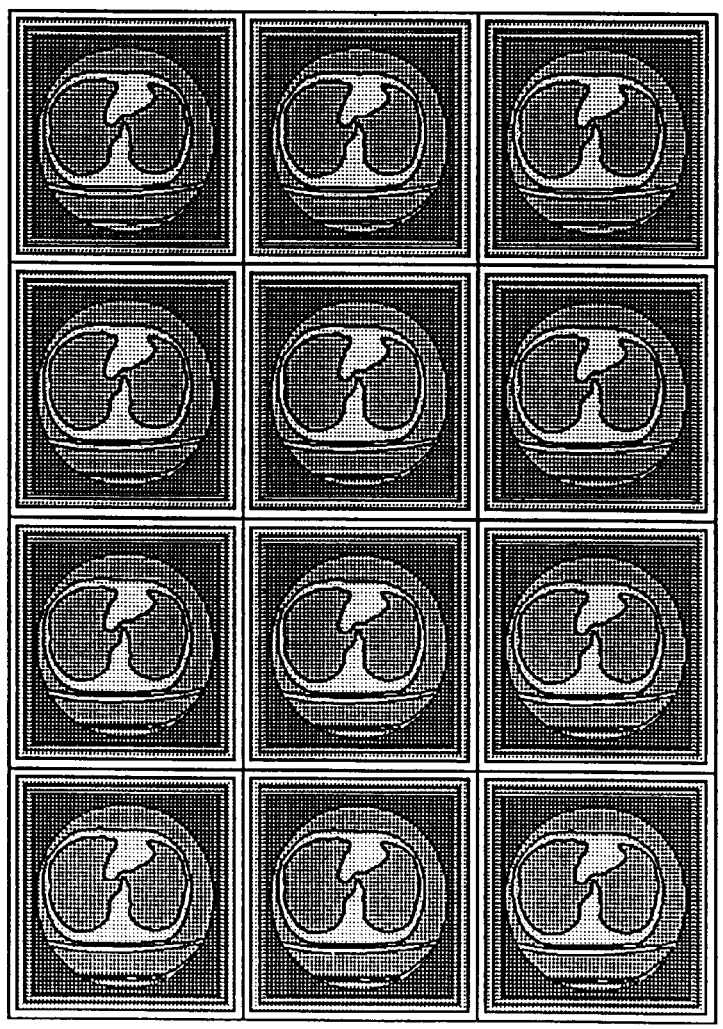
FIG. 15 is an illustration of a film in which boundary images are printed.
Figure 16:
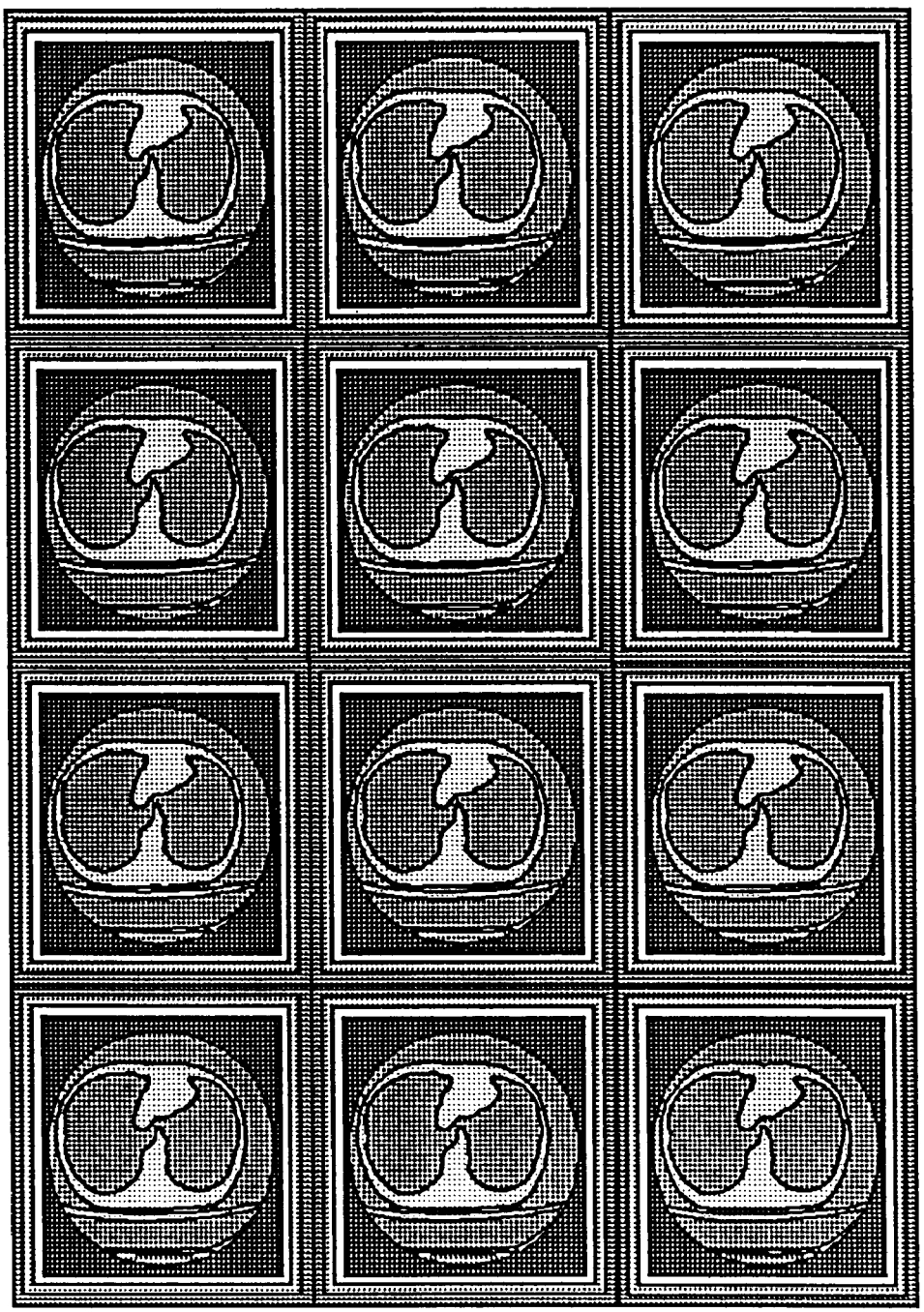
FIG. 16 is an illustration of a film in which boundary images are printed.

As the fourth embodiment, a boundary image having shades of gray as shown in FIG. 13 or FIG. 14 may be printed on a film. The boundary images shown in FIG. 13 and in FIG. 14 are in an inverted relation in shades of gray to each other. The main memory unit 76 in the image processing unit 58 stores boundary image information for printing these boundary images on the film. The boundary image information is output through CPU 68 to the scaling circuit 70, where the boundary image information is scaled in the same manner as the image information and the overlay information. The scaled boundary image information is written in the page memory 74 through the memory control circuit 71, and boundary images are printed on the film as shown in FIG. 15 or in FIG. 16 in the same procedure as in the first embodiment. It is conceivable that the boundary image information is stored in the main memory unit 63 in the control unit 57 similarly as in the first embodiment.

Figure 17:
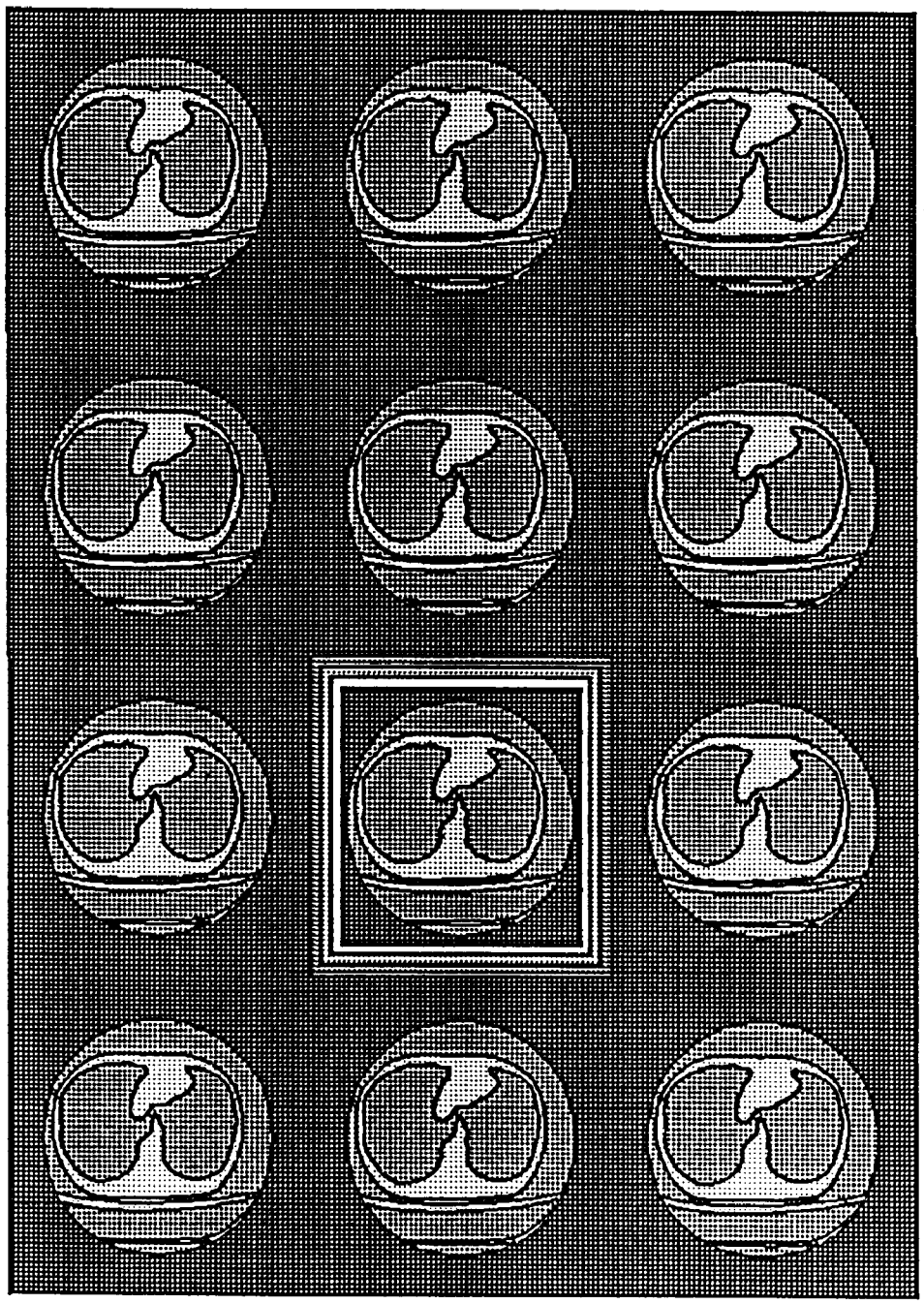
FIG. 17 is an illustration of a film in which a boundary image is printed for a specific image.

Also, a boundary image may be arranged to be printed for a specific image, as shown in FIG. 17. In this case, selecting the image is conducted by the control unit 57 prior to transfer of image information to the image processing unit 58.

As described above, the first to third laser imagers according to the present invention each are provided with the application software for setting the window information, the format information and the font information for image output, whereby the interactive indication of the application software can be indicated on an operated medical modality or workstation. Because of this arrangement, processing can be made within the laser imager even if medical modalities have portions specific to respective makers. Thus, they are excellent in compatibility. Further, the image output can be effected from a medical modality to the laser imager only by defining a link with window information, format information, font information, etc. for an image, which increases the processing rate.

The fourth laser imager performs the scaling process using different scaling functions, i.e., processes for image information and overlay information, so that it can properly scale an image and characters, permitting high-level image diagnosis.

The fifth laser imager performs the scaling process with different scaling rates for image information and overlay information, which obviates a need to prepare various character fonts to be overlaid on the image.

The sixth and seventh laser imagers are arranged to apply a gray-scale image to boundaries in the film, which facilitates inspection of diagnostic image. Especially, the seventh laser imager is arranged to apply a gray-scale image to a boundary of a specific image, so that the image may be distinctly outlined, which is helpful to image diagnosis.

What is claimed is:

1. A printing apparatus, comprising:
   a printer for printing image data, wherein said printer can perform specific image processing for image data to be printed; and
   data storage installed in said printer for storing an application software which is started by operating a terminal in network-connection with said printer and has a function of indicating to the terminal, based on a predetermined protocol, an interactive indication including image data processed by said printer for an operator of the terminal to input a parameter for the specific image processing so that the parameter is input from the terminal, wherein the terminal need not have a function of the specific image processing.

2. A printing apparatus according to claim 1, wherein the terminal comprises at least one of a medical modality and a workstation.

3. A printing apparatus according to claim 1, wherein the application software has a function of indicating to the terminal the indication on a monitor of the terminal.

4. A printing apparatus according to claim 1, wherein a plurality of terminals are in network-connection with said printer.

5. A printing apparatus according to claim 4, wherein the plurality of terminals comprise at least two medical modalities which are different in kind.

6. A method for printing image data, comprising the steps of:
   providing a printer for printing image data, with the printer capable of performing specific image processing for image data to be printed; and
   providing data storage in a printer for storing application software which is started by operating a terminal in network-connection with the printer and has a function of indicating to the terminal, based on a predetermined protocol, an interactive indication including image data processed by said printer for an operator of the terminal to input a parameter for the image processing so that the parameter is input from the terminal, wherein the terminal need not have a function of the specific image processing.

7. A method according to claim 6, wherein the terminal comprises at least one of a medical modality and a workstation.

8. A method according to claim 6, wherein the application software has a function of indicating to the terminal the indication on a monitor of the terminal.

9. A method according to claim 6, wherein a plurality of terminals are in network-connection with the printer.

10. A method according to claim 9, wherein the plurality of terminals comprise at least medical modalities which are different in kind.

11. A printing apparatus which can perform specific image processing for image data to be printed, comprising:
    a printer for printing image data; and
    data storage for storing an application software which is started by operating a terminal in network-connection with said printer and has a function of indicating to the terminal, based on a predetermined protocol, an interactive indication including image data processed by said printer for an operator of the terminal to input a parameter for the image processing so that the parameter is input from the terminal, wherein the terminal need not have a function of the specific image processing.

12. A printing method comprising the steps of:
    providing a printer for printing image data; and
    storing in the printer an application software which is started by operating a terminal in network-connection with the printer and has a function of indicating to the terminal, based on a predetermined protocol, an interactive indication including image data processed by said printer for an operator of the terminal to input a parameter for the image processing so that the parameter is input from the terminal, wherein the terminal need not have a function of the specific image processing.

13. A printing apparatus comprising:
    a printer for printing image data, wherein said printer can perform specific image processing for image data to be printed; and
    data storage installed in said printer for storing an application software which is started by operating a computer in network-connection with said printer and has a function of indicating to the computer, based on a predetermined protocol, an interactive indication including image data processed by said printer for an operator of the computer to input a parameter for the image processing so that the parameter is input from the computer, wherein the computer need not have a function of the specific image processing.

14. A printing method comprising the steps of:

providing a printer for printing image data, wherein the printer can perform specific image processing for image data to be printed; and providing data storage installed in the printer for storing an application software which is started by operating a computer in network-connection with the printer and has a function of indicating to the computer, based on a predetermined protocol, an interactive indication including image data processed by said printer for an operator of the computer to input a parameter for the image processing so that the parameter is input from the computer, wherein the computer need not have a function of the specific means processing.

* * * * *

UNITED STATES PATENT AND TRADEMARK OFFICE
CERTIFICATE OF CORRECTION

PATENT NO. : 6,631,499 B1
DATED : October 7, 2003
INVENTOR(S) : Osamu Tsujii

It is certified that error appears in the above-identified patent and that said Letters Patent is hereby corrected as shown below:

Column 7,
Line 7, "SCSI I/F 60" should read -- SCSI I/F 61 --.

Column 12,
Line 8, "means processing." should read -- image processing. --.

Signed and Sealed this

Twenty-ninth Day of June, 2004

JON W. DUDAS
*Acting Director of the United States Patent and Trademark Office*